United States Patent
Shue et al.

(10) Patent No.: US 6,271,136 B1
(45) Date of Patent: Aug. 7, 2001

(54) MULTI-STEP PLASMA PROCESS FOR FORMING TISIN BARRIER

(75) Inventors: Shau-Lin Shue, Hsinchu; Chung-Shi Liu, Hsin-Chu, both of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/542,809

(22) Filed: Apr. 4, 2000

(51) Int. Cl.[7] .................................................. H01L 21/44
(52) U.S. Cl. ........................ 438/687; 438/685; 438/686
(58) Field of Search ..................... 438/584, 653, 438/684–687; 257/751, 763

(56) References Cited

U.S. PATENT DOCUMENTS

| | | | |
|---|---|---|---|
| 5,770,520 | * 6/1998 | Zhao et al. | 438/653 |
| 5,824,599 | 10/1998 | Schacham-Diamand et al. | 438/678 |
| 5,851,367 | 12/1998 | Nguyen et al. | 204/192.34 |
| 5,913,144 | 6/1999 | Nguyen et al. | 438/643 |
| 5,918,150 | * 6/1999 | Nguyen et al. | 438/687 |
| 5,976,928 | 11/1999 | Kirlin et al. | 438/240 |
| 6,130,161 | * 10/2000 | Ashlyer et al. | 438/687 |

* cited by examiner

Primary Examiner—David Nelms
Assistant Examiner—Dung A. Le
(74) Attorney, Agent, or Firm—George O. Saile; Stephen B. Ackerman

(57) ABSTRACT

This invention relates to a robust method of fabrication used for semiconductor integrated circuit devices, and more specifically to the formation of an improved copper metal diffusion barrier layer, TiSiN, by a combination of metal-organic chemical vapor deposition (MOCVD) and multi-step plasma treatment that improves the diffusion resistant properties of the barrier layer (at both interfaces or surfaces) for both copper and silicon diffusion, in a single and dual damascene process, to fabricate reliable metal interconnects and contact vias. After a metal-organic chemical vapor deposition (MOCVD) to form $TiN_xC_yO_z$, $TiC_xN_yH_z$ complexes, a multi-step plasma treatment follows. The first plasma treatment bombards the surface with nitrogen and hydrogen ions to reduce the complexes to TiN. The TiN barrier layer is then treated with an enhanced plasma deposition by using silane and bombarding the surface with silicon ions. The net result is the formation of a TiSiN film with improved diffusion resistance.

39 Claims, 1 Drawing Sheet

US 6,271,136 B1

MULTI-STEP PLASMA PROCESS FOR FORMING TISIN BARRIER

RELATED PATENT APPLICATION

This Application is related to patent application Ser. No. 09/541481 filing date Apr. 3, 2000, assigned to the same assignee as current application.

BACKGROUND OF THE INVENTION

1. Field of the Invention

This invention relates to a robust method of fabrication used for semiconductor integrated circuit devices, and more specifically to the formation of an improved copper metal diffusion barrier layer, TiSiN, by a combination of metal-organic chemical vapor deposition (MOCVD) and multi-step plasma treatment that improves the diffusion resistant properties of the barrier layer (at both interfaces or surfaces) for both copper and silicon diffusion, in a single and dual damascene process, to fabricate reliable metal interconnects and contact vias.

2. Description of Related Art

Related patents and relevant literature now follow as Prior Art.

U.S. Pat. No. 5,770,520 (Zhao et al.) describes a TiSiN barrier layer comprising: N source, Si source and Ti source TiSiN barrier layer and form a Cu plug over TiSiN barrier layer. Described is a barrier layer in an integrated circuit structure which is formed in a via or contact opening over an underlying material in which diffusion of the underlying material (or filler material deposited over the barrier layer) through the barrier layer is inhibited without unduly increasing the thickness and resistively of the barrier layer. This is accomplished by substituting an amorphous material for the crystalline titanium nitride to thereby eliminate the present of gram boundaries which are believed to provide the diffusion paths through the titanium nitride material. In a preferred embodiment, the amorphous barrier layer comprises an amorphous ternary Ti—Si—N material formed using a source of titanium, a source of silicon, and a source of nitrogen, all in a chemical vapor deposition (CVD) system and by CVD techniques. Optional TiSiN deposition is outlined using plasma enhanced chemical vapor deposition (PECVD) using titanium organic precursors.

U.S. Pat. No. 5,851,367 (Nguyen et al.) describes a process to deposit TiSiN and then Cu over surfaces in a dual damascene structures. A method for selectively applying CVD copper to metallic surfaces, that are co-located with non-metallic surfaces, is described. After CVD deposition of copper and through a number of repeated cycles of etching and copper deposition, the copper overlying the metallic surface is accumulated to achieve the desired thickness; while the non-metallic surface remains free of copper. A method is also provided for the selective deposition of copper on metallic surfaces to fill interconnects in damascene IC structures. An IC with a copper layer overlying a metallic surface, co-located with a non-metallic surface, where the copper layer is grown through repeated cycles of ion etching and copper deposition, is also described.

U.S. Pat. No. 5,918,150 (Nguyen et al.) describes a process to deposit TiSiN and then Cu over surfaces. A method for etching metallic surface on an integrated circuit (IC) is described to minimize electrical resistance between the metallic surface and subsequently applied chemical vapor deposition (CVD)) copper. The metallic surface is etched with the ions of an inert gas, such as Ar, at low energy levels. An IC comprising a copper stud to interconnect dielectric interlevels with improved electrical conductivity is also described. In one embodiment, the copper stud is interfaced to diffusion barrier material and in another embodiment the copper stud is interfaced to a metallic surface.

U.S. Pat. No. 5,976,928 (Kirlin et al.) describes a "barrier saver" in a method of fabricating a ferroelectric capacitor structure by sequentially depositing a bottom electrode layer, a ferro-electric layer and a top electrode layer on a be structure. Optionally, with deposition of a layer of a conductive barrier material beneath the bottom electrode layer, to form a capacitor precursor structure, and planarizing the capacitor precursor structure by chemical mechanical polishing to yield the ferro-electric capacitor structure.

U.S. Pat. No. 5,913,144 (Nguyen et al.) teaches an oxygen containing plasma treatment of a TiN, TiON, TiSiN, TaSiN, TaN, TiW, TiWN, Mo, and WN and other barrier layers. The method claims improvement of adhesion of copper to the diffusion barrier material, such as TiN, in an integrated circuit substrate. The diffusion barrier is exposed to either a reactive oxygen species, or a plasma containing oxygen. A thin layer of the diffusion barrier is oxidized, typically less than 50 A, in response to exposure to the oxygen environment. CVD copper is then deposited over the oxidized diffusion barrier surface. The oxide layer improves bonding between the copper and diffusion barrier surfaces. The oxide layer permits the control of tolerances in the diffusion barrier preparation processes, and copper precursor, to be relaxed. An integrated circuit comprising an oxide layer between the diffusion barrier and the copper layer is also provided.

U.S. Pat. No. 5,824,599 (Schacham-Diamand et al.) describes a TiN barrier layer for a Cu interconnect. A method for utilizing electroless copper deposition is described to form interconnects on a semiconductor. Once a via or a trench is formed in a dielectric layer, a titanium nitride (TiN) or tantalum (Ta) barrier layer is deposited. Then, a catalytic copper need layer is conformally blanket deposited in vacuum over the barrier layer. After a dual damascene process with chemical mechanical polish (CMP) back of the excess conducting material and barrier material, the only remaining material are copper and barrier material inlaid in the via/trench openings. Then, an overlying silicon nitride (SiN) layer is formed above the exposed copper in order to form a dielectric barrier layer. The copper interconnect is fully encapsulated from the adjacent material by the TiN (or Ta) barrier layer and the overlying SiN layer

SUMMARY OF THE INVENTION

It is a general object of the present invention to provide an improved robust method of forming a copper metal diffusion barrier layer, in a single and dual damascene process, to fabricate reliable metal interconnects and contact vias. The formation of an improved copper metal diffusion barrier layer, TiSiN, is fabricated by using a combination of metal-organic chemical vapor deposition (MOCVD) and multi-step plasma treatment that improves the diffusion resistant properties of the barrier layer at both interfaces (for both copper and silicon) and improves adhesion properties in both single and dual damascene processes. This invention is used to manufacture reliable metal interconnects and contact vias in the fabrication of MOSFET and CMOS devices for both logic and memory applications. This invention makes good use of metal-organic chemical vapor deposition (MOCVD) combined with multi-step plasma treatment and a plasma-enhanced deposition.

For completeness provided by the present invention, is a semiconductor substrate with an insulating layer thereon. A copper metal interconnect typically is patterned within an insulating layer. In addition, a layer of interlevel dielectric (ILD) is deposited and patterned into a trench structure or "gap" opening. Provided can be both a single and dual damascene structure. The insulating material is typically silicon oxide compounds. Polysilicon gate structures (with silicides) and source/drain diffusions are typically upon or in a single crystal silicon substrate or IC module.

The first embodiment of the present invention is the deposition by metal-organic chemical vapor deposition (MOCVD) of the initial copper metal diffusion barrier layer, which consists of the following titanium precursor materials: TDMAT (tetrakis (dimethylamido) titanium), having the formula $Ti[N(CH_3)_2]_4$, TDEAT (tetrakis (diethylamido) titanium) having the formula $Ti[N(CH_3CH_2)_2]_4$, $Ti[NR]_4$ type compounds, and titanium tetrachloride, formula $TiCl_4$. Prior to the reduction of these precursor materials, the substrates undergo a thermal heating step in which the substrates are heated up to from approximately 200 to 450° C. Next, the substrates undergo a metal-organic chemical vapor deposition (MOCVD), while still hot, reducing the precursors of the titanium compounds (which reduce the carbon and oxygen impurities). $TiN_xC_yO_z$ and $TiC_xN_yH_z$ type compounds are produced by this process.

The next step in the process is another embodiment of this invention, the first plasma treatment step of the $TiN_xC_yO_z$, $TiC_xN_yH_z$ type layer produced by the metal-organic chemical vapor deposition (MOCVD) of the previous step. The $TiN_xC_yO_z$, $TiC_xN_yH_z$ type layer is treated with a plasma with nitrogen and hydrogen gases, plasma power from about 300 to 700 Watts, for a time from about 20 to 120 seconds and with gas flows of from about 500 to 2000 sccm, temperature from about 200 to 450° C. In the reactive gas plasma, the $TiN_xC_yO_z$, $TiC_xN_yH_z$ type layer is bombarded with reactive ionic gas species, which are single charge positive ions of $N_2+$ and $H_2+$. The surface of the $TiN_xC_yO_z$, $TiC_xN_yH_z$ type film is transformed in the nitrogen/hydrogen plasma into a TiN layer. Unwanted byproducts of $C_xH_y$ and $HNR_2$ are pumped out of the plasma chamber. The final net result of this plasma process is to transform the titanium containing layer into a titanium nitride, TiN, layer.

Next in the process is the another main embodiment of the current invention, the silane plasma treatment process of the barrier layer. Silicon is injected into the film by a silane gas plasma treatment, which is performed upon the surface of the barrier layer. The silane $SiH_4$ gas plasma treatment is performed under the following conditions: plasma power from about 300 to 700 W, plasma time from about 20 to 120 seconds, silane gas flows from about 500 to 2000 sccm, temperature from about 200 to 450° C. Silicon is injected into surface in silane gas plasma, by $Si^+$ ions. The silicon injection occurs first at the surface of the barrier, raising the surface concentration of silicon to high levels and forming a barrier layer of TiSiN. The next key step in the process, is the removal of byproducts by a pump and purge cycle, that produces a defect free and pure barrier layer of TiSiN.

In another embodiment of the present invention, the chemical vapor deposition (CVD) of the copper seed layer is performed upon the special TiSiN barrier layer. The chemical vapor deposited (CVD) copper seed layer exhibits improved adhesion upon the rigid, high density diffusion barrier. In a subsequent process step, an electrochemical deposition (ECD) of copper is used to fill the trench cavity, upon the copper seed layer.

The next processing step in the building of a single or dual damascene structure is the deposition of copper upon the seed layer, by electrochemical copper deposition (ECD). The kinetics of the electrochemical copper deposition process are based on a uniform, defect-free seed layer and barrier layer with good adhesion properties. The underlying layers improve and make wider the process window for the chemical vapor deposition (CVD) of copper to fill both single and dual damascene structures.

The final processing step in building of the single and dual damascene structure is the chemical mechanical polishing (CMP) back of the excess electrochemical deposited copper metal. The copper is chem-mech polished back without dishing. The copper is polished back so that only the copper that lies in the openings is left to form single and dual inlaid structures that include via and interconnect portions. Device applications include MOSFET and CMOS devices.

This invention has been summarized above and described with reference to the preferred embodiments. Some processing details have been omitted and are understood by those skilled in the art. More details of this invention are stated in the "DESCRIPTION OF THE PREFERRED EMBODIMENTS" section.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

This invention relates to an improved robust method of forming a copper metal diffusion barrier layer, in a single and dual damascene process, to fabricate reliable metal interconnects and contact vias. The formation of an improved copper metal diffusion barrier layer, TiSiN, is fabricated by using a combination of metal-organic chemical vapor deposition (MOCVD) and multi-step plasma treatment that improves the diffusion resistant properties of the barrier layer at both interfaces (for both copper and silicon) and improves adhesion properties in both single and dual damascene processes. This invention is used to manufacture reliable metal interconnects and contact vias in the fabrication of MOSFET and CMOS devices for both logic and memory applications. This invention makes good use of metal-organic chemical vapor deposition (MOCVD) combined with multi-step plasma treatment and plasma-enhanced deposition.

Plasma deposition is essentially the extension and enhancement of some of these chemical vapor deposition (CVD) processes, by using a plasma to dissociate and activate the reaction gases. The detail of the stoichiometry of the films is somewhat different by the two methods (this invention combines both techniques), but the key points of this invention are that the plasma processes can be accomplished at much lower substrate temperatures, important for ULSI devices, and plasma processes can yield unique film results. As an example, silicon nitride can be prepared from $SiCl_4$ and $NH_3$ by conventional chemical vapor deposition (CVD) in the temperature range 800–1400° C. For the corresponding plasma deposition technique, the substrate temperature can be reduced to below 400° C.

It has been found that one reason that just a TiN layer alone does not work, as well as, a TiSiN barrier layer is the possibility of pin holes in the TiN layer. Pin holes facilitate the movement (through fast surface diffusion) of the silicon through the TiN layer. To decrease, the movement of silicon through the TiN layer, a multi-step plasma process of the TiN layer has been successfully used to improve the barrier action of the now plasma enhanced deposition to form a silicon injected TiSiN layer. The plasma formed TiSiN layer is better than just TiN alone as a silicon and copper diffusion barrier. The multi-step plasma treatment does not have detrimental impact on transistors formed in the wafer since the plasma processes are performed at low temperatures.

Figure 1:
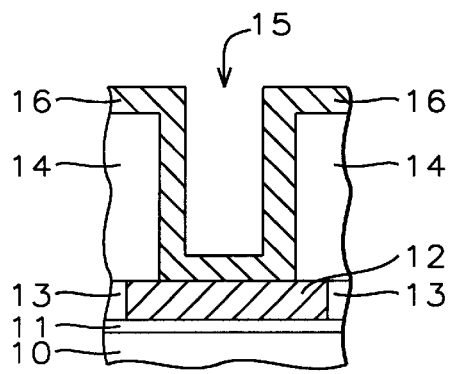
FIG. 1, which in cross-sectional representation illustrates a trench structure filled with the copper metal barrier layer, $TiC_x$, deposited by metal-organic chemical vapor deposition (MOCVD) from the reduction of titanium precursors.

Referring to FIG. 1 illustrated in cross-sectional drawing, for completeness provided by the present invention, is a semiconductor substrate 10 with an insulating layer 11. A copper metal interconnect 12 is patterned within an insulating layer 13. In addition, a layer of dielectric 14 is deposited and patterned into a trench 15 (gap) opening in FIG. 1. Provided is a single damascene structure 15 and/or a dual damascene structure (not shown in Figs.). The typical insulator material is silicon oxide type compounds. Also, polysilicon gate structures (with silicides) and source/drain diffusions are typically upon or in a single crystal silicon substrate or IC module (not shown in figures).

Referring again in more detail to FIG. 1, which is a cross-sectional representation shows the first embodiment of the present invention, the deposition by metal-organic chemical vapor deposition (MOCVD) of the initial copper metal diffusion barrier layer, which consists of the following titanium precursor materials, selected from the group consisting of: TDMAT (tetrakis (dimethylamido) titanium), having the formula $Ti[N(CH_3)_2]_4$, TDEAT (tetrakis (diethylamido) titanium) having the formula $Ti[N(CH_3CH_2)_2]_4$, $Ti[NR]_4$ type compounds, and titanium tetrachloride, formula $TiCl_4$. Prior to the reduction of these precursor materials, the substrates undergo a thermal heating step in a He or $N_2$, $H_2$ gas ambient with pressure from about 0.1 to 3 mTorr, in which the substrates are heated up to about 200 to 450° C. for about 10 to 20 sec. Next the substrates undergo a metal-organic chemical vapor deposition (MOCVD), while still hot, reducing the precursors of the titanium compounds (which reduce the carbon and oxygen impurities). $TiN_xC_yO_z$, $TiC_xN_yH_z$ type compounds (16) are produced by this process.

Figure 2:
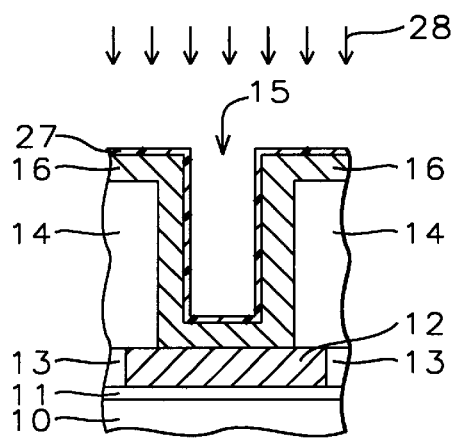
FIG. 2, which in cross-sectional representation illustrates two of the preferred embodiments of the present invention, the multi-step plasma deposition treatments, with nitrogen and hydrogen plasma, followed by a silane plasma deposition treatment, to form a TiSiN barrier layer.

Referring to FIG. 2 illustrated in cross-sectional drawing is one of the main embodiments of the current invention, the first plasma treatment 28 or process of the barrier layer 16, $TiN_xC_yO_z$, $TiC_xN_yH_z$ type film layer that was produced by the metal-organic chemical vapor deposition (MOCVD) of the previous step. The $TiN_xC_yO_z$, $TiC_xN_yH_z$ type film layer is treated with a plasma with nitrogen and hydrogen gases, plasma power from about 300 to 700 Watts, RF 13.56 MHz, pressure from about 0.1 to 3 mTorr, for a time from about 20 to 120 seconds and with gas flows of from about 500 to 2000 sccm, temperature from about 200 to 400° C. In the reactive gas plasma, the $TiN_xC_yO_z$, $TiC_xN_yH_z$ type film layer is bombarded with reactive ionic gas species of single charge positive ions of $N_2^+$ and $H_2^+$. The surface of the $TiN_xC_yO_z$, $TiC_xN_yH_z$ type film is transformed in the nitrogen/hydrogen plasma into titanium nitride, TiN (27). Unwanted byproducts of $C_xH_y$ and $HNR_2$ are pumped out of the plasma chamber. The final net result of this plasma process is to transform the titanium containing layer into a titanium nitride, TiN, (27) layer.

Again Referring to FIG. 2 illustrated in cross-sectional drawing is another one of the main embodiments of the current invention, the second plasma treatment, an enhanced plasma deposition treatment 28 or process of the barrier layer 16 and TiN layer 27. This second plasma treatment is performed using a silane plasma on the barrier layer. Silicon is injected into the film 27 by a silane gas plasma treatment, which is performed upon the surface of the barrier layer. The silane $SiH_4$ gas plasma treatment is performed under the following conditions: plasma power from about 300 to 700 W, RF 13.56 MHz, plasma time from about 20 to 120 seconds, silane gas flows from about 500 to 2000 sccm, pressure from about 0.1 to 3 mTorr, temperature from about 200 to 450° C. Silicon is injected into surface in silane gas plasma, by $Si^+$ ion. The silicon injection occurs first at the surface of the barrier, raising the surface concentration of silicon to high levels and forming a top surface barrier layer of $TiSi_xN_y$. The next key step in the process, is removal of byproducts by a pump and purge cycle, that produces a defect free and pure barrier top layer of TiSiN with an underlying TiN layer.

It was found that the silated silicon nitride compounds exhibit better adhesion properties when combined with chemical vapor deposition (CVD) of copper seed layer. Also, silated silicon nitride compounds exhibit better resistance to fluorine ion attack, F-, in subsequent processing. In summation, the metal-organic chemical vapor deposition (MOCVD) layer and multi-step plasma treatment with silated TiN barrier material, TiSiN, forms a good diffusion barrier material.

Figure 3:
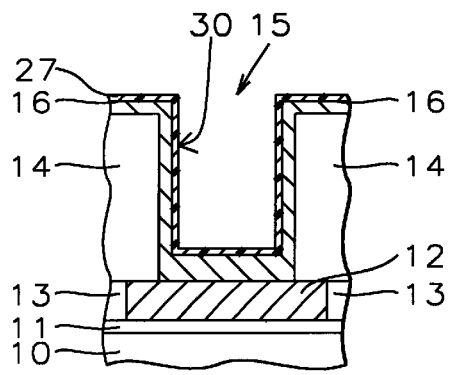
FIG. 3, which in cross-sectional representation illustrates the main embodiment of the present invention, the formation of the TiSiN rigid diffusion barrier layer, the end result of the processes including a pump and purge at end of the plasma processing.

Referring to FIG. 3 illustrated in cross-sectional drawing is shown the result of the main embodiments of the current invention, shown 30 (arrow) is the region of silated TiN, from the previous enhanced plasma deposition process forming a layer of TiSiN, after a pump and purge process to remove unwanted byproducts.

Figure 4:
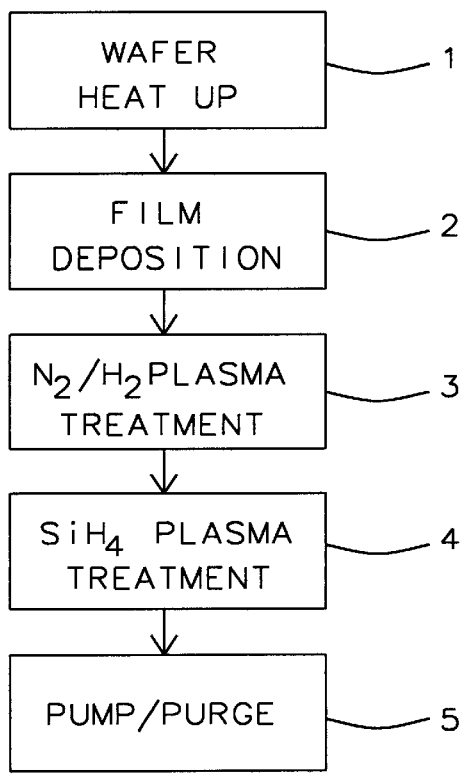
FIG. 4, which in block diagram summarizes the necessary process steps and sequence of steps necessary to form the TiSiN layer, which exhibits high diffusion resistance, as a rigid barrier layer to both copper and silicon (at both interfaces).

Referring to FIG. 4, which in block diagram summarizes the necessary process steps and sequence of steps necessary to form the TiSiN layer, which exhibits high diffusion resistance, as a rigid barrier layer to both copper and silicon (at both interfaces). Stop one (1) is the heat up of the wafer or substrate prior to the metal-organic chemical vapor deposition (MOCVD) step. Step two (2) in the block diagram is the metal-organic chemical vapor deposition (MOCVD) step. Multi-step plasma treatment follow, the first is a nitrogen/hydrogen plasma treatment (3) to form TiN and the second is an enhanced plasma deposition (4) with tilane to produce a TiSiN barrier layer. A pump and purge step (5) follows to remove unwanted byproducts.

Figure 5:
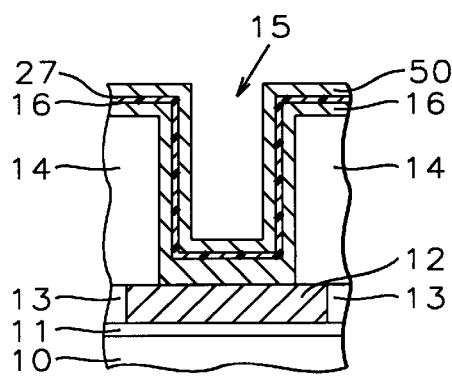
FIG. 5, which in cross-sectional representation illustrates another embodiment of the present invention, the copper seed layer with improved adhesion upon the rigid diffusion the barrier layer, TiSiN, for subsequent electrochemical deposition (ECD) of copper to fill the trench cavity.

Referring to FIG. 5, which in cross-sectional representation illustrates another embodiment of the present invention, the chemical vapor deposition (CVD) of the copper seed layer 50 upon the barrier layer 16. The chemical vapor deposited (CVD) copper seed layer 50 exhibits improved adhesion upon the rigid high density diffusion barrier layer 16 and silated barrier region (27) TiSiN. The seed layer can also be deposited by physical vapor deposition (PVD), sputtering process. The seed layer varies in thickness depending on product generation type, thickness from about 50 to 2500 Angstroms. In a subsequent process step, an electrochemical deposition (ECD) of copper is used to fill the trench cavity, upon the copper seed layer.

For completeness and not shown in the figures, is the next processing step in the building of a single or dual damascene structure, namely, the deposition of copper upon the seed layer, by electrochemical copper deposition (ECD). The kinetics of the electrochemical copper deposition process are based on a uniform, defect-free seed layer and barrier layer with good adhesion properties. The underlying layers improve and make wider the process window for the chemical vapor deposition (CVD) of copper to fill both single and dual damascene structures.

The final processing step in building of the single and dual damascene structure is the chemical mechanical polishing (CMP) back of the excess electrochemical deposited copper metal. The copper is chem-mech polished back without dishing. In addition, any excess seed layer and barrier layer are removed from the top substrate surface. The copper is polished back so that only the copper that lies in the openings is left to form single and dual inlaid structures that include via and interconnect portions. Device applications include MOSFET and CMOS devices.

While the invention has been particularly shown and described with reference to the preferred embodiments thereof, it will be understood by those skilled in the art that various changes in form and details may be made without departing from the spirit and scope of the invention.

What is claimed is:

1. A method comprising:
providing a substrate or wafer having an insulator layer deposited upon said substrate;
providing a first level of conducting wiring over said insulator layer;
depositing a first and second dielectric layer over said first level of conducting wiring;
patterning and etching the dielectric layers forming dual damascene trench/via openings;
heating up said substrate or wafer;
depositing by metal-organic chemical vapor deposition (MOCVD), a diffusion barrier layer over said dielectric layers covering and lining said trench/via;
exposing the said diffusion barrier layer to a $N_2$, $H_2$ gas plasma forming a nitride diffusion barrier layer;
exposing the said diffusion barrier layer to a silane gas plasma injecting silicon into said barrier layer;
pumping and purging out unwanted byproducts from said barrier layer and from said substrate or wafer;
depositing by chemical vapor deposition a copper seed layer over said diffusion barrier layer;
depositing by electrochemical deposition (ECD) copper conducting material over said copper seed layer and removing the excess material layers to from conducting copper dual inlaid structures.

2. The method of claim 1, wherein the substrate or wafer is semiconductor single crystal silicon or an IC module.

3. The method of claim 1, wherein both first and second layers dielectric layers are selected from the group consisting of silicon dioxide or silicon oxide.

4. The method of claim 1, wherein the substrate or wafer undergoes a heating step just prior to the diffusion barrier layer deposition, under the following process conditions: in a He or $N_2$, $H_2$ mixture gas ambient, pressure from about 0.1 to 3 mTorr, temperature form about 200 to 450° C., time from about 10 to 20 sec.

5. The method of claim 1, wherein in the trench or channel and via hole contact is lined with a diffusion barrier layer comprised of titanium complex compounds, formulas $TiN_xC_yO_z$, $TiC_xN_yH_z$, produced by metal-organic chemical vapor deposition (MOCVD) through the reduction of titanium precursor materials, selected from the group consisting of: TDMAT (tetrakis (dimethylamido) titanium), having the formula $Ti[N(CH_3)_2]_4$, TDEAT (tetrakis (diethylamido) titanium) having the formula $Ti[N(CH_3CH_2)_2]_4$, $Ti[NR]_4$ type compounds, and titanium tetrachloride, formula $TiCl_4$.

6. The method of claim 1, wherein the diffusion barrier layer consisting of $TiN_xC_yO_z$, $TiC_xN_yH_z$, type complexes, is RF plasma treated with a nitrogen and hydrogen gas mixture forming a TiN compound layer from about 50 to 500 Angstroms on the surface of the deposited diffusion barrier layer.

7. The method of claim 1, wherein the TiN compound layer on the surface of the deposited diffusion barrier layer is treated with a RF plasma enhanced deposition in silane gas, injecting silicon into the TiN surface, thus, forming a TiSiN compound layer on the surface of the deposited diffusion barrier layer.

8. The method of claim 1, wherein the TiSiN compound layer on the surface of the diffusion barrier layer is vacuum treated by performing repeated cycles of pump down to low pressure, and then, increasing the pressure by purging the chamber with an inert gas, thus, removing in the process unwanted byproducts, purifying and densifying the entire diffusion barrier layer.

9. The method of claim 1, wherein in the trench or channel and the via hole contact is lined with an adhesive copper seed layer on the diffusion barrier layer, the copper seed layer deposited by chemical vapor deposition (CVD), or by physical vapor deposition (PVD) sputtering, and the seed layer material is comprised of a copper metal layer, thickness from about 50 to 2500 Angstroms.

10. The method of claim 1, wherein the conducting material layers for conducting interconnect lines and via contacts comprise the following conducting type materials: electrochemical deposition (ECD) of copper, upon the copper seed layer.

11. The method of claim 1, wherein the ECD copper is electrochemically deposited in the trench/via structures with a wide process window upon said seed layer and said barrier layer, without seams or voids.

12. The method of claim 1, wherein each level of conducting structure is planarized by removing excess material, the method being selected from the group consisting of: planarization by chemical mechanical polish (CMP), milling, ion milling, and/or etching, which leave the copper in trench/via openings, forming single and dual inlaid structures that include conducting interconnect lines and contact vias.

13. The method of claim 1, wherein multilevel conducting structures are fabricating by repeating the process described herein.

14. A method for fabricating a TiSiN metal diffusion barrier layer for integrated circuits on a substrate with single or dual damascene structures comprising:

providing a substrate or wafer having an insulator layer of silicon dioxide deposited upon said substrate;

providing a first level of copper conducting wiring over said insulator layer;

depositing a first and second dielectric layer over said first level of conducting wiring;

patterning and etching the dielectric layers forming both single and dual damascene trench/via structure openings for interconnects and contact vias;

heating up said substrate or wafer;

depositing by metal-organic chemical vapor deposition (MOCVD), a diffusion barrier layer of $TiN_xC_yO_z$, $TiC_xN_yH_z$, type complexes over said dielectric layers covering and lining said trench/via openings;

exposing the of $TiN_xC_yO_z$, $TiC_xN_yH_z$, type complexes which form the diffusion barrier layer to a $N_2$, $H_2$ gas plasma forming a TiN diffusion barrier layer;

exposing the said barrier layer to a silane gas plasma enhanced deposition injecting silicon into said barrier layer forming a TiSiN barrier layer;

vacuum pumping and purging removing unwanted byproducts from said TiSiN barrier layer and from said substrate or wafer, by placement of said substrate or wafer in a vacuum chamber;

depositing by chemical vapor deposition a copper seed layer over said diffusion barrier layer;

depositing by electrochemical deposition (ECD) copper conducting material over the said copper seed layer and said barrier layer and removing the excess material layers, excess copper and excess barrier layer material, by planarizing the surface by chemical mechanical polish (CMP) to form conducting copper dual inlaid structures which are conducting interconnect lines and contact vias.

15. The method of claim 14, wherein the substrate or wafer is semiconductor single crystal silicon or an IC module.

16. The method of claim 14, wherein both first and second layers dielectric layers are selected from the group consisting of silicon dioxide or silicon oxide.

17. The method of claim 14, wherein the substrate or wafer undergoes a heating step just prior to the diffusion barrier layer deposition, under the following process conditions: in a He or $N_2$, $H_2$ mixture gas ambient, pressure from about 0.1 to 3 mTorr, temperature form about 200 to 450° C., time from about 10 to 20 sec.

18. The method of claim 14, wherein in the trench or channel and via hole contact is lined with a diffusion barrier layer comprised of titanium complex compounds, formulas $TiN_xC_yO_z$, $TiC_xN_yH_z$, produced by metal-organic chemical vapor deposition (MOCVD) through the reduction of titanium precursor materials, selected from the group consisting of: TDMAT (tetrakis (dimethylamido) titanium), having the formula $Ti[N(CH_3)_2]_4$, TDEAT (tetrakis (diethylamido) titanium) having the formula $Ti[N(CH_3CH_2)_2]_4$, $Ti[NR]_4$ type compounds, and titanium tetrachloride, formula $TiCl_4$.

19. The method of claim 14, wherein the diffusion barrier layer consisting of $TiN_xC_yO_z$, $TiC_xN_yH_z$, type complexes, is RF plasma treated with a nitrogen and hydrogen gas mixture forming a TiN compound layer from about 50 to 500 Angstroms on the surface of the deposited diffusion barrier layer.

20. The method of claim 14, wherein the TiN compound layer on the surface of the deposited diffusion barrier layer is treated with a RF plasma enhanced deposition in silane gas, injecting silicon into the TiN surface, thus, forming a TiSiN compound layer on the surface of the deposited diffusion barrier layer.

21. The method of claim 14, wherein the TiSiN compound layer on the surface of the diffusion barrier layer is vacuum treated by performing repeated cycles of pump down to low pressure, and then, increasing the pressure by purging the chamber with an inert gas, thus, removing in the process unwanted byproducts, purifying and densifying the entire diffusion barrier layer.

22. The method of claim 14, wherein in the trench or channel and the via hole contact is lined with an adhesive copper seed layer on the diffusion barrier layer, the copper seed layer deposited by chemical vapor deposition (CVD), or by physical vapor deposition (PVD) sputtering, and the seed layer material is comprised of a copper metal layer, thickness from about 50 to 2500 Angstroms.

23. The method of claim 14, wherein the conducting material layers for conducting interconnect lines and via contacts comprise the following conducting type materials: electrochemical deposition (ECD) of copper, upon the copper seed layer.

24. The method of claim 14, wherein the ECD copper is electrochemically deposited in the trench/via structures with a wide process window upon said seed layer and said barrier layer, without seams or voids.

25. The method of claim 14, wherein each level of conducting structure is planarized by removing excess material, the method being selected from the group consisting of: planarization by chemical mechanical polish (CMP), milling, ion milling, and/or etching, which leave the copper in trench/via openings, forming single and dual inlaid structures that include conducting interconnect lines and contact vias.

26. The method of claim 14, wherein multilevel conducting structures are fabricating by repeating the process described herein.

27. A method for fabricating MOSFET and CMOS devices on a silicon semiconductor substrate with single or dual damascene structures using electrochemical deposition (ECD) of copper and chemical vapor deposition (CVD) of copper seed layer on a multi-step plasma treated TiSiN metal diffusion barrier layer, comprising:

providing a substrate or wafer having an insulator layer of silicon dioxide deposited upon said substrate;

providing a first level of copper conducting wiring over said insulator layer;

depositing a first and second dielectric layer over said first level of conducting wiring;

patterning and etching the dielectric layers forming both single and dual damascene trench/via structure openings for interconnects and contact vias;

heating up said substrate or wafer;

depositing by metal-organic chemical vapor deposition (MOCVD), a diffusion barrier layer of $TiN_xC_yO_z$, $TiC_xN_yH_z$, type complexes over said dielectric layers covering and lining said trench/via openings;

exposing the of $TiN_xC_yO_z$, $TiC_xN_yH_z$, type complexes which form the diffusion barrier layer to a $N_2$, $H_2$ gas plasma forming a TiN diffusion barrier layer;

exposing the said barrier layer to a silane gas plasma enhanced deposition injecting silicon into said barrier layer forming a TiSiN barrier layer;

vacuum pumping and purging removing unwanted byproducts from said TiSiN barrier layer and from said substrate or wafer, by placement of said substrate or wafer in a vacuum chamber;

depositing by chemical vapor deposition a copper seed layer over said diffusion barrier layer;

depositing by electrochemical deposition (ECD) copper conducting material over the said copper seed layer and said barrier layer and removing the excess material layers, excess copper and excess barrier layer material, by planarizing the surface by chemical mechanical polish (CMP) to form conducting copper dual inlaid structures which are conducting interconnect lines and contact vias.

28. The method of claim 27, wherein the substrate or wafer is semiconductor single crystal silicon or an IC module.

29. The method of claim 27, wherein both first and second layers dielectric layers are selected from the group consisting of silicon dioxide or silicon oxide.

30. The method of claim 27, wherein the substrate or wafer undergoes a heating step just prior to the diffusion barrier layer deposition, under the following process conditions: in a He or $N_2$, $H_2$ mixture gas ambient, pressure from about 0.1 to 3 mTorr, temperature form about 200 to 450° C., time from about 10 to 20 sec.

31. The method of claim 27, wherein in the trench or channel and via hole contact is lined with a diffusion barrier layer comprised of titanium complex compounds, formulas $TiN_xC_yO_z$, $TiC_xN_yH_z$, produced by metal-organic chemical vapor deposition (MOCVD) through the reduction of titanium precursor materials, selected from the group consisting of: TDMAT (tetrakis (dimethylamido) titanium), having the formula $Ti[N(CH_3)_2]_4$, TDEAT (tetrakis (diethylamido) titanium) having the formula $Ti[N(CH_3CH_2)_2]_4$, $Ti[NR]_4$ type compounds, and titanium tetrachloride, formula $TiCl_4$.

32. The method of claim 27, wherein the diffusion barrier layer consisting of $TiN_xC_yO_z$, $TiC_xN_yH_z$, type complexes, is RF plasma treated with a nitrogen and hydrogen gas mixture forming a TiN compound layer from about 50 to 500 Angstroms on the surface of the deposited diffusion barrier layer.

33. The method of claim 27, wherein the TiN compound layer on the surface of the deposited diffusion barrier layer is treated with a RF plasma enhanced deposition in silane gas, injecting silicon into the TiN surface, thus, forming a TiSiN compound layer on the surface of the deposited diffusion barrier layer.

34. The method of claim 27, wherein the TiSiN compound layer on the surface of the diffusion barrier layer is vacuum treated by performing repeated cycles of pump down to low pressure, and then, increasing the pressure by purging the chamber with an inert gas, thus, removing in the process unwanted byproducts, purifying and densifying the entire diffusion barrier layer.

35. The method of claim 27, wherein in the trench or channel and the via hole contact is lined with an adhesive copper seed layer on the diffusion barrier layer, the copper seed layer deposited by chemical vapor deposition (CVD), or by physical vapor deposition (PVD) sputtering, and the seed layer material is comprised of a copper metal layer, thickness from about 50 to 2500 Angstroms.

36. The method of claim 27, wherein the conducting material layers for conducting interconnect lines and via contacts comprise the following conducting type materials: electrochemical deposition (ECD) of copper, upon the copper seed layer.

37. The method of claim 27, wherein the ECD copper is electrochemically deposited in the trench/via structures with a wide process window upon said seed layer and said barrier layer, without seams or voids.

38. The method of claim 27, wherein each level of conducting structure is planarized by removing excess material, the method being selected from the group consisting of: planarization by chemical mechanical polish (CMP), milling, ion milling, and/or etching, which leave the copper in trench/via openings, forming single and dual inlaid structures that include conducting interconnect lines and contact vias.

39. The method of claim 27, wherein multilevel conducting structures are fabricating by repeating the process described herein.

* * * * *